(12) United States Patent
Kashio et al.

(10) Patent No.: US 8,507,044 B2
(45) Date of Patent: Aug. 13, 2013

(54) MOLDING MATERIAL COMPOSED OF POLYORGANOSILOXANE COMPOUND, SEALING MATERIAL, AND SEALED OPTICAL DEVICE

(75) Inventors: Mikihiro Kashio, Tokyo (JP); Takashi Tamada, Tokyo (JP); Naohumi Izumi, Tokyo (JP)

(73) Assignee: Lintec Corporation, Tokyo (JP)

( * ) Notice: Subject to any disclaimer, the term of this patent is extended or adjusted under 35 U.S.C. 154(b) by 123 days.

(21) Appl. No.: 12/866,871

(22) PCT Filed: Dec. 24, 2008

(86) PCT No.: PCT/JP2008/073433
§ 371 (c)(1),
(2), (4) Date: Sep. 15, 2010

(87) PCT Pub. No.: WO2009/101753
PCT Pub. Date: Aug. 20, 2009

(65) Prior Publication Data
US 2011/0034659 A1    Feb. 10, 2011

(30) Foreign Application Priority Data

Feb. 14, 2008 (JP) ................................. 2008-032964
Oct. 2, 2008 (JP) ................................. 2008-257233

(51) Int. Cl.
C08G 77/24 (2006.01)

(52) U.S. Cl.
USPC ................ 427/387; 428/447; 528/42; 528/33

(58) Field of Classification Search
USPC ....................................................... 428/447
See application file for complete search history.

(56) References Cited

U.S. PATENT DOCUMENTS

| | | | | |
|---|---|---|---|---|
| 4,923,775 | A | * | 5/1990 | Schank .......... 430/58.8 |
| 5,047,492 | A | * | 9/1991 | Weidner et al. ........ 528/15 |
| 5,346,932 | A | | 9/1994 | Takahashi et al. |
| 6,770,726 | B1 | * | 8/2004 | Arkles et al. ........... 528/42 |
| 7,868,112 | B2 | * | 1/2011 | Oikawa et al. ........ 526/279 |
| 2004/0191479 | A1 | | 9/2004 | Hatakeyama et al. |
| 2008/0051487 | A1 | | 2/2008 | Kumon et al. |

FOREIGN PATENT DOCUMENTS

| | | |
|---|---|---|
| JP | 3-221561 A | 9/1991 |
| JP | 2002-167552 A | 6/2002 |
| JP | 2003-246930 A | 9/2003 |
| JP | 2004-310019 A | 11/2004 |
| JP | 2004-359933 A | 12/2004 |
| JP | 2005-263869 A | 9/2005 |
| JP | 2006-321832 A | 11/2006 |
| JP | 2006-328231 A | 12/2006 |
| JP | 2008-158002 A | 7/2008 |
| JP | 2008-266585 A | 11/2008 |
| JP | 2009-30013 A | 2/2009 |
| WO | WO 2005/080459 A1 | 9/2005 |

OTHER PUBLICATIONS

International Search Report, dated Mar. 10, 2009 and issued in PCT/JP2008/073433.

* cited by examiner

*Primary Examiner* — Margaret Moore
(74) *Attorney, Agent, or Firm* — Birch, Stewart, Kolasch & Birch, LLP (57) ABSTRACT

A molding material includes a polyorganosiloxane compound having a ladder structure including a repeating unit shown by the following formula (I) in the molecule as a main component, a sealing material includes the molding material, and a sealed optical device includes an optical device that is sealed with a cured product of the sealing material. The molding material produces a cured product that exhibits excellent transparency and heat resistance for a long time.

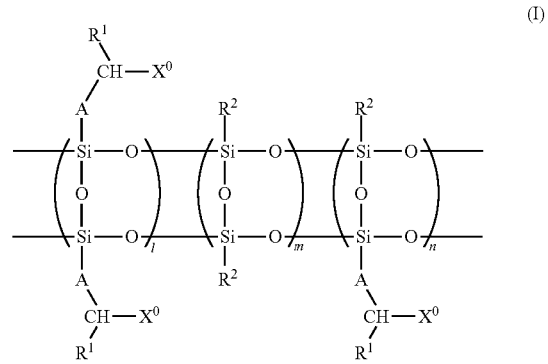

wherein A represents a single bond or a linking group, $R^1$ represents a hydrogen atom or an alkyl group having 1 to 6 carbon atoms, $X^0$ represents a halogen atom, a haloalkyl group having 1 to 10 carbon atoms, or a cyano group, $R^2$ represents a substituted or unsubstituted phenyl group, an alkyl group having 1 to 20 carbon atoms which may have a substituent (excluding a halogen atom and a cyano group), or an alkenyl group having 2 to 20 carbon atoms, and l, m, and n are arbitrary positive numbers, provided that l and n are not 0 at the same time.

5 Claims, 4 Drawing Sheets

MOLDING MATERIAL COMPOSED OF POLYORGANOSILOXANE COMPOUND, SEALING MATERIAL, AND SEALED OPTICAL DEVICE

TECHNICAL FIELD

The present invention relates to a molding material including a polyorganosiloxane compound which produces a cured product exhibiting excellent transparency and heat resistance as the main component, a sealing material which utilizes the molding material, and a sealed optical device including an optical device which is sealed with a cured product of the sealing material.

BACKGROUND ART

A laser (e.g., semiconductor laser diode (LD)), a light-emitting device (e.g., light-emitting diode (LED)), a light-receiving device, a hybrid optical device, an optical integrated circuit, and the like have been known as optical devices. In recent years, an optical device which is blue or white light having a short emission peak wavelength has been developed, and widely used. Since the brightness of light-emitting devices with a short emission peak wavelength has remarkably increased, the amount of heat generated by the optical devices tends to increase.

An optical device is normally used as a sealed optical device in which the optical device is sealed with a cured product of a sealing material.

A sealing material which mainly contains a transparent epoxy resin that produces a cured product exhibiting excellent heat resistance, etc. has been known as an optical device sealing material.

Along with an increase in brightness of optical devices, however, the cured product of the optical device sealing material is exposed to high-energy light or a high temperature generated by the optical device for a long time. This may cause a deterioration in the cured product, so that cracks or yellowing (coloration) may occur. The optical device may not be continuously used when cracks have occurred in the cured product of the optical device sealing material. A decrease in transparency may occur when coloration has occurred, so that the brightness of the optical device may decrease.

In view of the above problems, Patent Documents 1 to 3 disclose an optical device sealing material which contains a polyorganosiloxane compound as the main component. Patent Documents 1 to 3 disclose that the polyorganosiloxane compound enables production of a sealed optical device which exhibits excellent crack resistance and heat resistance.

However, when using a cured product of the optical device sealing material disclosed in Patent Documents 1 to 3 which contains the polyorganosiloxane compound as the main component, it may be difficult to sufficiently prevent yellowing which may occur when the cured product is subjected to high-energy light or heat generated by the optical device for a long time. Therefore, development of an optical device sealing material which can produce a cured product which exhibits more excellent heat resistance has been desired.

Patent Document 1: JP-A-2004-359933
Patent Document 2: JP-A-2005-263869
Patent Document 3: JP-A-2006-328231

DISCLOSURE OF THE INVENTION

Problems to be Solved by the Invention

The present invention was conceived in view of the above situation. An object of the present invention is to provide a molding material which produces a cured product which exhibits excellent heat resistance and rarely undergoes coloration even when subjected to high-energy light or heat for a long time, a sealing material which utilizes the molding material, and a sealed optical device in which an optical device is sealed with a cured product of the sealing material.

Means for Solving the Problems

As a result of extensive studies in order to achieve the above object, the inventors found that a cured product of a molding material which mainly includes a polyorganosiloxane compound having a ladder structure including a repeating unit shown by the following formula (I) in the molecule exhibits excellent transparency and heat resistance for a long time. This finding has led to the completion of the present invention.

According to a first aspect of the present invention, there is provided the following molding material (see (i) to (vii)).

(i) A molding material comprising a polyorganosiloxane compound as a main component, the polyorganosiloxane compound having a ladder structure including a repeating unit shown by the following formula (I) in the molecule,

[Chemical Formula 1]

(I)

wherein A represents a single bond or a linking group, $R^1$ represents a hydrogen atom or an alkyl group having 1 to 6 carbon atoms, $X^0$ represents a halogen atom, a haloalkyl group having 1 to 10 carbon atoms, or a cyano group, $R^2$ represents a substituted or unsubstituted phenyl group, an alkyl group having 1 to 20 carbon atoms which may have a substituent (excluding a halogen atom and a cyano group), an alkenyl group having 2 to 20 carbon atoms, or a group shown by -$A^1$-CH($X^1$)—$R^3$ (wherein $A^1$ represents a single bond or a linking group, $X^1$ represents a hydrogen atom or a group shown by OG (wherein G represents a protecting group for a hydroxyl group), and $R^3$ represents a hydrogen atom or an alkyl group having 1 to 6 carbon atoms), and l, m, and n are individually 0 or an arbitrary natural number, provided that l and n are not 0 at the same time.

(ii) The molding material according to (i), wherein the polyorganosiloxane compound is obtained by reacting a silane compound (1) shown by $X^0$—CH($R^1$)-A-Si($OR^4$)$_p$($X^2$)$_{3-p}$, wherein $X^0$, $R^1$, and A are the same as defined above, $R^4$ represents an alkyl group having 1 to 6 carbon atoms, $X^2$ represents a halogen atom, and p is an integer from 0 to 3, and a silane compound (2) shown by $R^2Si(OR^5)_q(X^3)_{3-q}$, wherein $R^2$ is the same as defined above, $R^5$ represents an alkyl group having 1 to 6 carbon atoms, $X^3$ represents a halogen atom, and q is an integer from 0 to 3, in a molar ratio of 5:95 to 100:0 in the presence of a catalyst.

(iii) A molding material comprising a polyorganosiloxane compound as a main component, the polyorganosiloxane compound being obtained by reacting a silane compound (1) shown by $X^0CH(R^1)$-A-$Si(OR^4)_p(X^2)_{3-p}$, wherein $X^0$ represents a halogen atom, a haloalkyl group having 1 to 10 carbon atoms, or a cyano group, $R^1$ represents a hydrogen atom or an alkyl group having 1 to 6 carbon atoms, A represents a single bond or a linking group, $R^4$ represents an alkyl group having 1 to 6 carbon atoms, $X^2$ represents a halogen atom, and p is an integer from 0 to 3, and a silane compound (2) shown by $R^2Si(OR^5)_q(X^3)_{3-q}$, wherein $R^2$ is the same as defined above, $R^5$ represents an alkyl group having 1 to 6 carbon atoms, $X^3$ represents a halogen atom, and q is an integer from 0 to 3, in a molar ratio of 5:95 to 100:0 in the presence of a catalyst.

(iv) The molding material according to any one of (i) to (iii), wherein A represents an alkylene group having 1 to 10 carbon atoms or an alkyleneoxy group having 1 to 10 carbon atoms which bonds to the silicon atom via a carbon atom.

(v) The molding material according to any one of (i) to (iv), wherein $X^0$ represents a chlorine atom, a fluoroalkyl group having 1 to 10 carbon atoms, or a cyano group.

(vi) The molding material according to any one of (i) to (v), wherein the polyorganosiloxane compound has a weight average molecular weight of 1,000 to 10,000.

(vii) The molding material according to any one of (i) to (vi), the molding material not containing a curing agent.

According to a second aspect of the present invention, there is provided the following sealing material (see (viii) and (ix)).

(viii) A sealing material comprising the molding material according to any of (i) to (vii).

(ix) The sealing material according to (viii), the sealing material being an optical device sealing material.

According to a third aspect of the present invention, there is provided the following sealed optical device (see (x)).

(x) A sealed optical device comprising an optical device, the optical device being sealed with a cured product of the sealing material according to (ix).

Effects of the Invention

The molding material according to the present invention produces a cured product which exhibits excellent transparency (i.e., does not show coloration) and excellent heat resistance for a long time even when subjected to high-energy light or heat generated by an optical device which has a short emission wavelength (i.e., high brightness).

Since the sealed optical device according to the present invention utilizes the molding material according to the present invention, the sealed optical device exhibits excellent heat resistance, and rarely shows coloration even when used for a long time.

EXPLANATION OF SYMBOLS

10A: Lamp-shaped sealed LED
10B: SMD-type sealed LED
11: Cured product of optical device sealing material
11a: Optical device sealing material
12: Mold
13: Cuboid casing
14a, 14b: LED chip
15: Wire
16: Injection unit of optical device sealing material (nozzle)

BEST MODE FOR CARRYING OUT THE INVENTION

The present invention is described in detail below.

1) Molding Material

The molding material according to the present invention is characterized by including a polyorganosiloxane compound as a main component, the polyorganosiloxane compound being a polyorganosiloxane compound having a ladder structure including a repeating unit shown by the formula (I) in the molecule (hereinafter may be referred to as "polyorganosiloxane compound (Ia)"), or a polyorganosiloxane compound obtained by reacting a silane compound (1) shown by $X^0$—$CH(R^1)$-A-$Si(OR^3)_p(X^1)_{3-p}$ and a silane compound (2) shown by $R^2Si(OR^4)_q(X^2)_{3-q}$ in a molar ratio of 5:95 to 100:0 (=silane compound (1):silane compound (2)) in the presence of a catalyst (hereinafter may be referred to as "polyorganosiloxane compound (Ib)").

Note that an expression "including the polyorganosiloxane compound (Ia) or the polyorganosiloxane compound (Ib) as a main component" used herein means including at least one type of polyorganosiloxane compound (Ia) or polyorganosiloxane compound (Ib), and may further include an additive component described later insofar as the object of the present invention is not impaired, as components of an optical device sealing material. The content of the polyorganosiloxane compound (Ia) or the polyorganosiloxane compound (Ib) is normally 70 wt % or more, preferably 80 wt % or more, and more preferably 90 wt % or more, based on the total amount of the molding material.

In the formula (I), A represents a single bond or a linking group.

Examples of the linking group include a substituted or unsubstituted alkylene group, a substituted or unsubstituted alkyleneoxy group, a substituted or unsubstituted arylene group, a substituted or unsubstituted aryleneoxy group, a combination thereof, and the like.

When A is a substituted or unsubstituted alkyleneoxy group, the alkylene group site of the alkyleneoxy group bonds to the silicon atom. When A is a substituted or unsubstituted aryleneoxy group, the arylene group site bonds to the silicon atom.

Examples of the substituted or unsubstituted alkylene group and the alkylene group that forms the substituted or unsubstituted alkyleneoxy group include an alkylene group having 1 to 10 carbon atoms such as a methylene group, an ethylene group, a propylene group, a trimethylene group, a tetramethylene group, a pentamethylene group, and a hexamethylene group; an alkylene group having 2 to 10 carbon atoms which includes an unsaturated bond such as a vinylene group, a propenylene group, a butenylene group, and a pentenylene group; and the like.

Examples of a substituent for the alkylene group include an alkoxy group such as a methoxy group and an ethoxy group; an alkylthio group such as a methylthio group and an ethylthio group; an alkoxycarbonyl group such as a methoxycarbonyl group and an ethoxycarbonyl group; and the like.

Examples of the substituted or unsubstituted arylene group and the arylene group of the substituted or unsubstituted aryleneoxy group include an o-phenylene group, an m-phenylene group, a p-phenylene group, a 2,6-naphthylene group, and the like.

Examples of a substituent for the arylene group include a cyano group; a nitro group; a halogen atom such as a fluorine atom, a chlorine atom, and a bromine atom; an alkoxy group such as a methoxy group and an ethoxy group; an alkylthio group such as a methylthio group and an ethylthio group; and the like. The substituent may be bonded to an arbitrary position of the alkylene group or the arylene group. A plurality of identical or different substituents may be bonded to the alkylene group or the arylene group.

Examples of a combination of the substituted or unsubstituted alkylene group, the substituted or unsubstituted arylene group, the substituted or unsubstituted alkyleneoxy group, and the substituted or unsubstituted aryleneoxy group include groups shown by the following formulas. Note that the asterisk indicates the bonding position with the silicon atom.

[Chemical Formula 2]

A is preferably an alkylene group having 1 to 6 carbon atoms or an alkyleneoxy group having 1 to 6 carbon atoms which bonds to the silicon atom via a carbon atom, and more preferably an ethylene group or an ethyleneoxy group which bonds to the silicon atom via a carbon atom, since a cured product exhibiting excellent transparency and heat resistance for a long time can be obtained.

$R^1$ represents a hydrogen atom or an alkyl group having 1 to 6 carbon atoms such as a methyl group, an ethyl group, an n-propyl group, an isopropyl group, an n-butyl group, a sec-butyl group, an isobutyl group, a tert-butyl group, an n-pentyl group, and an n-hexyl group. Among these, a hydrogen atom is preferable.

$X^0$ represents a halogen atom, a haloalkyl group having 1 to 10 carbon atoms, or a cyano group.

Examples of the halogen atom include a fluorine atom, a chlorine atom, a bromine atom, an iodine atom, and the like.

A haloalkyl group having 1 to 10 carbon atoms refers to an alkyl group having 1 to 10 carbon atoms wherein at least one hydrogen atom is substituted with a halogen atom. Specific examples include groups shown by $CH_2F$, $CHF_2$, $CF_3$, $CF_3CF_2$, $(CF_3)_2CH$, $(CF_3)_2CF$, $CH_3CF(CF_3)$, $CF_3(CF_2)_2$, $CF_3(CF_2)_3$, $CF_3(CF_2)_4$, $CF_3(CF_2)_5$, $CF_3(CF_2)_6$, $CF_3(CF_2)_7$, $CHCl_2$, $CHBr_2$, $CH_2ClCHCl$, $CH_2BrCHBr$, $CH_2ICHI$, and the like.

In order to obtain a cured product exhibiting excellent transparency and heat resistance for a long time, $X^0$ is preferably a chlorine atom, a fluoroalkyl group having 1 to 10 carbon atoms, or a cyano group, and particularly preferably a chlorine atom, a trifluoromethyl group, or a cyano group.

$R^2$ represents a substituted or unsubstituted phenyl group, an alkyl group having 1 to 20 carbon atoms which may have a substituent (excluding a halogen atom and a cyano group), an alkenyl group having 2 to 20 carbon atoms, or a group shown by $-A^1-CH(X^1)-R^3$.

Examples of a substituent for the substituted or unsubstituted phenyl group include an alkyl group such as a methyl group, an ethyl group, an n-propyl group, an isopropyl group, an n-butyl group, a sec-butyl group, an isobutyl group, a tert-butyl group, an n-pentyl group, an n-hexyl group, an n-heptyl group, an n-octyl group, and an isooctyl group; an alkoxy group such as a methoxy group and an ethoxy group; a halogen atom such as a fluorine atom and a chlorine atom; and the like.

Specific examples of the substituted or unsubstituted phenyl group include a phenyl group, a 2-chlorophenyl group, a 4-methylphenyl group, a 3-ethylphenyl group, a 2-methoxyphenyl group, and the like.

Examples of the the substituted or unsubstituted alkyl group having 1 to 20 carbon atoms include a methyl group, an ethyl group, an n-propyl group, an isopropyl group, an n-butyl group, a sec-butyl group, an isobutyl group, a tert-butyl group, an n-pentyl group, an n-hexyl group, an n-heptyl group, an n-octyl group, an isooctyl group, an n-nonyl group, an n-decyl group, an n-dodecyl group, and the like.

Examples of a substituent for the alkyl group having 1 to 20 carbon atoms include a glycidyl group, a glycidoxy group, an epoxy group, a 3,4-epoxycyclohexyl group, an acryloxy group, a methacryloxy group, a mercapto group, a carboxyl group, an acetylacetonyl group; a substituted or unsubstituted amino group such as an amino group, an aminoethylamino group, and a phenylamino group; and the like.

Examples of the alkenyl group having 2 to 20 carbon atoms include a vinyl group, an allyl group, and the like.

$A^1$ in the group shown by $-A^1-CH(X^1)-R^3$ represents a single bond or a linkage group similar to that mentioned in connection with A.

$X^1$ represents a hydrogen atom or a group shown by OG.

G in the group shown by OG represents a protecting group for a hydroxyl group.

The protecting group may be a protecting group which is known as a protecting group for a hydroxyl group. Examples of the protecting group include an acyl-type protecting group such as an acetyl group and a benzoyl group; a silyl-type protecting group such as a trimethylsilyl group, a triethylsilyl group, a tert-butyldimethylsilyl group, and a tert-butyldiphenylsilyl group; an acetal-type protecting group such as a methoxymethyl group, a methoxyethoxymethyl group, a 1-ethoxyethyl group, a tetrahydropyran-2-yl group, and a tetrahydrofuran-2-yl group; an alkoxycarbonyl-type protect- ing group such as a tert-butoxycarbonyl group; an ether-type protecting group such as a methyl group, an ethyl group, a tert-butyl group, an octyl group, an allyl group, a triphenylmethyl group, a benzyl group, a p-methoxybenzyl group, a fluorenyl group, a trityl group, and a benzhydryl group; and the like. Among these, an acyl-type protecting group is preferable.

$R^3$ represents a hydrogen atom or an alkyl group having 1 to 6 carbon atoms in the same way as $R^1$.

l, m, and n are individually 0 or an arbitrary natural number, provided that l and n are not 0 at the same time, because a group shown by $X^0$—$CH(R^1)$-A- (wherein $X^0$, $R^1$, and A are the same as defined above) is essential for the compound used in the present invention in order to achieve its object.

The repeating unit of the polyorganosiloxane compound (Ia) is shown by any of the following formulas (a) to (c). Note that the repeating unit shown by the formula (a) or the repeating unit shown by the formula (c) is indispensable.

[Chemical Formula 3]

wherein $R^1$, $R^2$, A, and $X^0$ are the same as defined above. The polyorganosiloxane compound (Ia) may be a homopolymer of a repeating unit shown by the formula (a) or (c), a copolymer of two or more repeating units shown by the formula (a) and/or the formula (c), or a copolymer of at least one repeating unit shown by the formula (a) and/or the formula (c) and a repeating unit shown by the formula (b). The repeating unit shown by the formula (c) may bond in the polymer in an inverted form (upside down).

The polyorganosiloxane compound (Ia) has a linearly extending ladder structure. Whether or not the compound has a ladder structure may be confirmed by, for example, measuring the infrared absorption spectrum or X-ray diffraction of the compound.

The polyorganosiloxane compound (Ia) may be produced by an arbitrary method, but is preferably produced by reacting a silane compound (1) shown by $X^0$—$CH(R^1)$-A-$Si(OR^4)_p$ $(X^2)_{3-p}$ and a silane compound (2) shown by $R^2Si(OR^5)_q$ $(X^3)_{3-q}$ in a molar ratio of 5:95 to 100:0 (=silane compound (1):silane compound (2)) in the presence of a catalyst. The details thereof are the same as those of a method of producing the polyorganosiloxane compound (Ib) described later.

The polyorganosiloxane compound (Ib) is produced by reacting a silane compound (1) shown by $X^0$—$CH(R^1)$-A-Si $(OR^4)_p(X^2)_{3-p}$ and a silane compound (2) shown by $R^2Si$ $(OR^5)_q(X^3)_{3-q}$ in a molar ratio of 5:95 to 100:0 (=silane compound (1):silane compound (2)) in the presence of a catalyst.

In the silane compound (1) shown by $X^0$—$CH(R^1)$-A-Si $(OR^4)_p(X^2)_{3-p}$, $X^0$, A, and $R^1$ are the same as defined above.

$R^4$ represents an alkyl group having 1 to 6 carbon atoms similar to the alkyl group having 1 to 6 carbon atoms mentioned for $R^1$. Among the alkyl groups, a methyl group and an ethyl group are preferable from the viewpoint of economy, an increase in the yield of the target compound, and the like.

$X^2$ represents a halogen atom such as a fluorine atom, a chlorine atom, or a bromine atom.

p is an integer from 0 to 3. When p is 2 or more, two or more $OR^4$ may be either the same or different. When (3−p) is 2 or more, two or more $X^2$ may be either the same or different.

Specific examples of the silane compound (1) include trialkoxysilane compounds such as chloromethyltrimethoxysilane, bromomethyltriethoxysilane, 2-chloroethyltripropoxysilane, 2-bromoethyltributoxysilane, 3-chloropropyltrimethoxysilane, 3-chloropropyltriethoxysilane, 3-chloropropyltripropoxysilane, 3-chloropropyltributoxysilane, 3-bromopropyltrimethoxysilane, 3-bromopropyltriethoxysilane, 3-bromopropyltripropoxysilane, 3-bromopropyltributoxysilane, 3-fluoropropyltrimethoxysilane, 3-fluoropropyltriethoxysilane, 3-fluoropropyltripropoxysilane, 3-fluoropropyltributoxysilane, 3-iodopropyltrimethoxysilane, 2-chloroethyltrimethoxysilane, 3-chloropropyltriethoxysilane, 4-chlorobutyltripropoxysilane, 5-chloropentyltripropoxysilane, 2-chloropropyltrimethoxysilane, 2-(2-chloroethoxy)ethyltrimethoxysilane, 2-(2-chloroethoxy)ethyltriethoxysilane, 2-(2-chloroethoxy)ethyltripropoxysilane, 2,2,2-trifluoroethyltrimethoxysilane, 2,2,2-trifluoroethyltriethoxysilane, 2,2,2-trifluoroethyltripropoxysilane, 3,3,3-trifluoropropyltrimethoxysilane, 3,3,3-trifluoropropyltriethoxysilane, 3,3,3-trifluoropropyltripropoxysilane, 2-(perfluorohexyl)ethyltrimethoxysilane, 2-(perfluorohexyl)ethyltriethoxysilane, 2-(perfluorohexyl)ethyltripropoxysilane, o-(2-chloroethyl)phenyltripropoxysilane, m-(2-chloroethyl)phenyltrimethoxysilane, p-(2-chloroethyl)phenyltriethoxysilane, p-(2-fluoroethyl)phenyltrimethoxysilane, cyanomethyltrimethoxysilane, cyanomethyltriethoxysilane, 2-cyanoethyltrimethoxysilane, 2-cyanoethyltriethoxysilane, 2-cyanoethyltripropoxysilane, 3-cyanopropyltrimethoxysilane, 3-cyanopropyltriethoxysilane, 3-cyanopropyltripropoxysilane, 3-cyanopropyltributoxysilane, 4-cyanobutyltrimethoxysilane, 5-cyanopentyltrimethoxysilane, 2-cyanopropyltrimethoxysilane, 2-(cyanomethoxy)ethyltrimethoxysilane, 2-(2-cyanoethoxy)ethyltrimethoxysilane, o-(cyanomethyl)phenyltripropoxysilane, m-(cyanomethyl)

phenyltrimethoxysilane, p-(cyanomethyl)phenyltriethoxysilane, and p-(2-cyanoethyl)phenyltrimethoxysilane;

halogenosilane compounds such as chloromethyltrichlorosilane, bromomethylbromodimethoxysilane, 2-chloroethyldichloromethoxysilane, 2-bromoethyldichloroethoxysilane, 3-chloropropyltrichlorosilane, 3-chloropropyltribromosilane, 3-chloropropyldichloromethoxysilane, 3-chloropropyldichloroethoxysilane, 3-chloropropylchlorodimethoxysilane, 3-chloropropylchlorodiethoxysilane, 3-bromopropyldichloroethoxysilane, 3-bromopropyltribromosilane, 3-bromopropyltrichlorosilane, 3-bromopropylchlorodimethoxysilane, 3-fluoropropyltrichlorosilane, 3-fluoropropylchlorodimethoxysilane, 3-fluoropropyldichloromethoxysilane, 3-fluoropropylchlorodiethoxysilane, 3-iodopropyltrichlorosilane, 4-chlorobutylchlorodiethoxysilane, 3-chloro-n-butylchlorodiethoxysilane, 2-(2-chloroethoxy)ethyltrichlorosilane, 2-(2-chloroethoxy)ethylbromodiethoxysilane, 2-(2-chloroethoxy)ethyldichloropropoxysilane, 2,2,2-trifluoroethyltrichlorosilane, 2,2,2-trifluoroethylbromodimethoxysilane, 2,2,2-trifluoroethyldibromoethoxysilane, 3,3,3-trifluoropropyltrichlorosilane, 3,3,3-trifluoropropylbromodimethoxysilane, 3,3,3-trifluoropropyldibromoethoxysilane, 2-(perfluorohexyl)ethyltrichlorosilane, 2-(perfluorohexyl)ethylchlorodiethoxysilane, 2-(perfluorohexyl)ethyldichloromethoxysilane, cyanomethyltrichlorosilane, cyanomethylbromodimethoxysilane, 2-cyanoethyldichloromethoxysilane, 2-cyanoethyldichloroethoxysilane, 3-cyanopropyltrichlorosilane, 3-cyanopropyltribromosilane, 3-cyanopropyldichloromethoxysilane, 3-cyanopropyldichloroethoxysilane, 3-cyanopropylchlorodimethoxysilane, 3-cyanopropylchlorodiethoxysilane, 4-cyanobutylchlorodiethoxysilane, 3-cyano-n-butylchlorodiethoxysilane, 2-(2-cyanoethoxy)ethyltrichlorosilane, 2-(2-cyanoethoxy)ethylbromodiethoxysilane, 2-(2-cyanoethoxy)ethyldichloropropoxysilane, o-(2-cyanoethyl)phenyltrichlorosilane, m-(2-cyanoethyl)phenylmethoxydibromosilane, p-(2-cyanoethyl)phenyldimethoxychlorosilane, and p-(2-cyanoethyl)phenyltribromosilane; and the like.

These silane compounds may be used either individually or in combination.

Among these, trialkoxysilane compounds in which the group shown by $X^0$—CH($R^1$)-A- in the formula (1) is a 3-chloropropyl group, a 2-(2-chloroethoxy)ethyl group, a 3,3,3-trifluoropropyl group, a 2-cyanoethyl group, or a 3-cyanopropyl group are preferable due to the capability of producing a molding material with excellent heat resistance.

In the silane compound (2) shown by $R^2$—Si(O$R^5$)$_q$ ($X^3$)$_{3-q}$, $R^2$ is the same as defined above.

$R^5$ represents an alkyl group having 1 to 6 carbon atoms similar to that represented by $R^4$, and $X^3$ represents a halogen atom similar to that represented by $X^2$.

q is an integer from 0 to 3. When q is 2 or more, two or more groups represented by O$R^5$ may be either the same or different. When (3−q) is 2 or more, two or more $X^3$ may be either the same or different.

Specific examples of the silane compound (2) include substituted or unsubstituted phenylsilane compounds such as phenyltrimethoxysilane, 4-methoxyphenyltrimethoxysilane, 2-chlorophenyltrimethoxysilane, phenyltriethoxysilane, 2-methoxyphenyltriethoxysilane, phenyldimethoxyethoxysilane, phenyldiethoxymethoxysilane, phenyltrichlorosilane, phenylchlorodimethoxysilane, phenyldichloromethoxysilane, phenyltribromosilane, phenylchloromethoxyethoxysilane, 4-methoxyphenyltrichlorosilane, 2-chlorophenyltrichlorosilane, phenyltrichlorosilane, and 2-ethoxyphenyltrichlorosilane;

alkylsilane compounds such as methyltrimethoxysilane, methyltriethoxysilane, ethyltrimethoxysilane, ethyltriethoxysilane, n-propyltrimethoxysilane, n-butyltriethoxysilane, i-butyltrimethoxysilane, n-pentyltriethoxysilane, n-hexyltrimethoxysilane, i-octyltriethoxysilane, dodecyltrimethoxysilane, methyldimethoxyethoxysilane, methyldiethoxymethoxysilane, methyltrichlorosilane, methylchlorodimethoxysilane, methyldichloromethoxysilane, methyldichloromethoxysilane, methyltribromosilane, methylchlorodiethoxysilane, ethyltrichlorosilane, ethylchlorodimethoxysilane, ethyldichloromethoxysilane, ethyltribromosilane, n-propyltrichlorosilane, n-propylchlorodimethoxysilane, and n-propyldichloromethoxysilane;

substituted alkylsilane compounds such as glycidyltrimethoxysilane, glycidyltriethoxysilane, glycidyltripropoxysilane, glycidyltributoxysilane, glycidyltrichlorosilane, glycidylchlorodimethoxysilane, glycidyldichloromethoxysilane, glycidylchlorodiethoxysilane, glycidyldichloroethoxysilane, glycidyltribromosilane, 3-glycidoxypropyltrimethoxysilane, 3-glycidoxypropyltriethoxysilane, 3-glycidoxypropyltripropoxysilane, 3-glycidoxypropyltributoxysilane, 3-glycidoxypropyltrichlorosilane, 3-glycidoxypropylchlorodimethoxysilane, 3-glycidoxypropyldichloromethoxysilane, 3-glycidoxypropylchlorodiethoxysilane, 3-glycidoxypropyldichloroethoxysilane, 3-glycidoxypropyltribromosilane, 2-(3,4-epoxycyclohexyl)ethyltrimethoxysilane, 2-(3,4-epoxycyclohexyl)ethyltriethoxysilane, 2-(3,4-epoxycyclohexyl)ethyltripropoxysilane, 2-(3,4-epoxycyclohexyl)ethyltributoxysilane, 3-acryloxypropyltrimethoxysilane, 3-acryloxypropyltriethoxysilane, 3-acryloxypropyltripropoxysilane, 3-acryloxypropyltributoxysilane, 3-methacryloxypropyltrimethoxysilane, 3-methacryloxypropyltriethoxysilane, 3-methacryloxypropyltripropoxysilane, 3-methacryloxypropyltributoxysilane, 3-methacryloxypropyltrichlorosilane, 3-methacryloxypropylchlorodimethoxysilane, 3-methacryloxypropyldichloromethoxysilane, 3-methacryloxypropylchlorodiethoxysilane, 3-methacryloxypropyldichloroethoxysilane, 3-methacryloxypropyltribromosilane, 3-[(2-aminoethyl)amino]propyltrimethoxysilane, 3-aminopropyltrimethoxysilane, 3-phenylaminopropyltrimethoxysilane, 3-carboxypropyltrimethoxysilane, 3-mercaptopropyltrimethoxysilane, 3-mercaptopropyltriethoxysilane, 3-mercaptopropyltripropoxysilane, 3-mercaptopropyltributoxysilane, 3-mercaptopropyltrichlorosilane, 3-mercaptopropylchlorodimethoxysilane, 3-mercaptopropyldichloromethoxysilane, 3-mercaptopropylchlorodiethoxysilane, 3-mercaptopropyldichloroethoxysilane, and 3-mercaptopropyltribromosilane;

alkenylsilane compounds such as vinyltrimethoxysilane, vinyltriethoxysilane, vinyltripropoxysilane, vinyltributoxysilane, and allyltrimethoxysilane;

silane compounds in which $R^2$ is a group represented by the formula -$A^1$-CH($X^1$)—$R^3$, and $X^1$ is a group represented by the formula OG, such as 3-acetoxypropyltrimethoxysilane, 3-acetoxypropyltriethoxysilane, 3-acetoxypropyltripropoxysilane, 3-acetoxypropyltributoxysilane, 3-propionyloxypropyltrimethoxysilane, 3-propionyloxypropyltriethoxysilane, 3-benzoyloxypropyltrimethoxysilane, 3-benzoyloxypropyltriethoxysilane, 3-benzoyloxypropyltripropoxysilane, 3-benzoyloxypropyltributoxysilane, 2-trimethylsilyloxyethyltrimethoxysilane, 3-triethylsilyloxypropyltriethoxysilane, 3-(2-tetrahydropyranyloxy)propyltripropoxysilane, 3-(2-tetrahydrofuranyloxy)propyltributoxysilane, 3-methoxymethyloxypropyltrimethoxysilane, 3-methoxyethoxymethyloxypropyltriethoxysilane, 3-(1-ethoxyethyloxy)propyltripropoxysilane, 3-(t-butoxycarbonyloxy)propyltrimethoxysilane, 3-tert-butoxypropyltrimethoxysilane, 3-benzyloxypropyltriethoxysilane, 3-triphenylmethoxypropyltriethoxysilane;
3-acetoxypropyltrichlorosilane, 3-acetoxypropyltribromosilane, 3-acetoxypropyldichloromethoxysilane, 3-acetoxypropyldichloroethoxysilane, 3-acetoxypropylchlorodimethoxysilane, 3-acetoxypropylchlorodiethoxysilane, 3-benzoyloxypropyltrichlorosilane, 3-trimethylsilyloxypropylchlorodimethoxysilane, 3-triethylsilyloxypropyldichloromethoxysilane, 3-(2-tetrahydropyranyloxy)propylchlorodiethoxysilane, 3-(2-tetrahydrofuranyloxy)propyldichloroethoxysilane, 3-methoxymethyloxypropyltribromosilane, 3-methoxyethoxymethyloxypropyltrichlorosilane, 3-(1-ethoxyethyloxy)propylchlorodimethoxysilane, 3-tert-butoxycarbonyloxypropyldichloromethoxysilane, 3-tert-butoxypropylchlorodiethoxysilane, 3-triphenylmethoxypropyldichloroethoxysilane, and 3-benzyloxypropyltribromosilane; and the like.

These silane compounds (2) may be used either individually or in combination.

The molar ratio of the silane compound (1) to the silane compound (2) may be arbitrarily determined within the range of 5:95 to 100:0, but is preferably 20:80 to 70:30, and more preferably 25:75 to 60:40. A polyorganosiloxane compound (Ib) which produces a cured product exhibiting excellent heat resistance can be obtained in high yield by utilizing the silane compound (1) and the silane compound (2) in the above ratio.

An acid catalyst or a base catalyst may be used as the catalyst which is used when reacting the silane compound (1) and the silane compound (2).

Examples of the acid catalyst include an inorganic acid such as hydrochloric acid, sulfuric acid, nitric acid, and phosphoric acid, and an organic acid such as methanesulfonic acid, trifluoromethanesulfonic acid, benzenesulfonic acid, p-toluenesulfonic acid, acetic acid, and trifluoroacetic acid.

Examples of the base catalyst include organic bases such as trimethylamine, triethylamine, lithium diisopropylamide, lithium bis(trimethylsilyl)amide, pyridine, 1,8-diazabicyclo[5.4.0]-7-undecene, aniline, picoline, 1,4-diazabicyclo[2.2.2]octane, and imidazole; organic base hydroxides such as tetramethylammonium hydroxide and tetraethylammonium hydroxide; metal alcoholates such as sodium methoxide, sodium ethoxide, sodium tert-butoxide, and potassium tert-butoxide; metal hydrides such as sodium hydride and calcium hydride; metal hydroxides such as sodium hydroxide, potassium hydroxide, and calcium hydroxide; metal carbonates such as sodium carbonate, potassium carbonate, and magnesium carbonate; metal hydrogencarbonates such as sodium hydrogencarbonate, and potassium hydrogencarbonate; and the like.

The amount of the catalyst used is normally 0.1 to 10 mol %, and preferably 1 to 5 mol %, based on the amount of the silane compound (1), or the silane compound (1) and the silane compound (2) (hereinafter may be referred to as "silane compounds").

There are no particular limitations to the method for reacting the silane compound (1) and the silane compound (2). For example, the catalyst may be added to a solution of the silane compound (1) and the silane compound (2), and the mixture may be stirred at a given temperature.

The solvent used for the reaction may be appropriately selected depending on the type of the silane compounds and the like. Examples of the solvent include water; an aromatic hydrocarbon such as benzene, toluene, and xylene; an ester such as methyl acetate, ethyl acetate, propyl acetate, and methyl propionate; a ketone such as acetone, methyl ethyl ketone, methyl isobutyl ketone, and cyclohexanone; an alcohol such as methyl alcohol, ethyl alcohol, n-propyl alcohol, isopropyl alcohol, n-butyl alcohol, isobutyl alcohol, sec-butyl alcohol, and tert-butyl alcohol; and the like. These solvents may be used either individually or in combination.

Among these, water, aromatic hydrocarbons, and a mixture thereof are preferable, with a mixture of water and toluene being particularly preferable. When using water and toluene, the ratio (volume ratio) of water to toluene is preferably 1:9 to 9:1, and more preferably 7:3 to 3:7.

The solvent is used so that the total amount of the silane compounds is normally 0.1 to 10 mol, and preferably 0.5 to 10 mol, per liter of the solvent.

The reaction temperature of the silane compounds is normally in the range from 0° C. to the boiling point of the solvent, and preferably 20 to 100° C. If the temperature is too low, the reaction proceeds only insufficiently. If the temperature is too high, gel production may not be suppressed. The reaction time is normally 30 minutes to 20 hours.

The reaction is terminated by adding an aqueous solution of an alkali such as sodium hydrogencarbonate when an acid catalyst is used or an acid such as hydrochloride when a base catalyst is used. A salt produced in this instance may be removed by filtration, washing, or the like to obtain the target polyorganosiloxane compound (Ib).

When the resulting polyorganosiloxane compound (Ia) or polyorganosiloxane compound (Ib) is a copolymer, the copolymer may be any (co)polycondensate such as a random (co)polymer, a partial block (co)polymer, or a complete block (co)polymer.

The weight average molecular weight (Mw) of the polyorganosiloxane compound (Ia) or the polyorganosiloxane compound (Ib) is normally 1,000 to 10,000, and preferably 1,500 to 6,000. The weight average molecular weight (Mw) may be determined as a standard polystyrene-reduced value by gel permeation chromatography (GPC) using tetrahydrofuran (THF) as a solvent, for example.

The molding material according to the present invention may include only the polyorganosiloxane compound (Ia) (or the polyorganosiloxane compound (Ib)), or may include another component in addition to the polyorganosiloxane compound (Ia) (or the polyorganosiloxane compound (Ib)) insofar as the object of the present invention is not impaired.

Examples of other components include an antioxidant, a UV absorber, a photo stabilizer, a diluent, a silane coupling agent, and the like.

The antioxidant is added to prevent deterioration due to oxidation during heating.

Examples of the antioxidant include a phenol-based antioxidant, a sulfur-containing antioxidant, a phosphorus-containing antioxidant, and the like.

Specific examples of the phenol-based antioxidant include monophenols such as 2,6-di-tert-butyl-p-cresol, dibutylhydroxytoluene, butylated hydroxyanisole, 2,6-di-tert-butyl-p-ethylphenol, and stearyl-beta-(3,5-di-tert-butyl-4-hydroxyphenyl)propionate; bisphenols such as 2,2'-methylenebis(4- methyl-6-tert-butyl phenol), 2,2'-methylenebis(4-ethyl-6-tert-butylphenol), 4,4'-thiobis(3-methyl-6-tert-butylphenol), 4,4'-butylidenebis(3-methyl-6-tert-butylphenol), and 3,9-bis[1,1-dimethyl-2-{beta-(3-tert-butyl-4-hydroxy-5-methylphenyl)propionyloxy}ethyl]-2,4,8,10-tetraoxaspiro[5,5]undecane; polymer-type phenols such as 1,1,3-tris(2-methyl-4-hydroxy-5-tert-butylphenyl)butane, 1,3,5-trimethyl-2,4,6-tris(3,5-di-tert-butyl-4-hydroxybenzyl)benzene, tetrakis[methylene-3-(3',5'-di-tert-butyl-4'-hydroxyphenyl)propionate]methane, bis[3,3'-bis-(4'-hydroxy-3'-tert-butylphenyl)butylic acid]glycol ester, 1,3,5-tris(3',5'-di-tert-butyl-4'-hydroxybenzyl)-S-triazine-2,4,6-(1H,3H,5H)trion, and tocophenol; and the like.

Examples of the sulfur-containing antioxidant include dilauryl-3,3'-thiodipropionate, dimyristyl-3,3'-thiodipropionate, and distearyl-3,3'-thiodipropionate, and the like.

Examples of the phosphorus-containing antioxidant include phosphites such as triphenylphosphite, diphenylisodecylphosphite, phenyldiisodecylphosphite, tris(nonylphenyl)phosphite, diisodecylpentaerythritolphosphite, tris(2,4-di-tert-butylphenyl)phosphite, cyclic neopentane tetraylbis(octadecyl)phosphite, cyclic neopentane tetraylbis(2,4-di-tert-butylphenyl)phosphite, cyclic neopentane tetraylbis(2,4-di-tert-butyl-4-methylphenyl)phosphite, and bis[2-tert-butyl-6-methyl-4-{2-(octadecyloxycarbonyl)ethyl}phenyl] hydrogen phosphite;

oxaphosphaphenanthrene oxides such as 9,10-dihydro-9-oxa-10-phosphaphenanthrene-10-oxide, 10-(3,5-di-tert-butyl-4-hydroxybenzyl)-9,10-dihydro-9-oxa-10-phosphaphenanthrene-10-oxide, and 10-decyloxy-9,10-dihydro-9-oxa-10-phosphaphenanthrene-10-oxide; and the like.

These antioxidants may be used either individually or in combination. The antioxidant is normally used in an amount of 0.01 to 10 parts by weight relative to 100 parts by weight of a polyorganosiloxane compound.

The UV absorber is added in order to increase the light resistance of the molding material.

Examples of the UV absorber include salicylic acids such as phenyl salicylate, p-tert-butylphenyl salicylate, and p-octylphenyl salicylate; benzophenones such as 2,4-dihydroxybenzophenone, 2-hydroxy-4-methoxybenzophenone, 2-hydroxy-4-octoxybenzophenone, 2-hydroxy-4-dodecyloxybenzophenone, 2,2'-dihydroxy-4-methoxybenzophenone, 2,2'-dihydroxy-4,4'-dimethoxybenzophenone, and 2-hydroxy-4-methoxy-5-sulfobenzophenone; benzotriazoles such as 2-(2'-hydroxy-5'-methylphenyl)benzotriazole, 2-(2'-hydroxy-5'-tert-butylphenyl)benzotriazole, 2-(2'-hydroxy-3',5'-di-tert-butylphenyl)benzotriazole, 2-(2'-hydroxy-3'-tert-butyl-5'-methylphenyl)-5-chlorobenzotriazole, 2-(2'-hydroxy-3',5'-di-tert-butylphenyl)-5-chlorobenzotriazole, 2-(2'-hydroxy-3',5'-di-tert-amylphenyl)benzotriazole, and 2-{(2'-hydroxy-3',3",4",5",6"-tetrahydrophthalimidemethyl) benzotriazole; hindered amines such as bis(2,2,6,6-tetramethyl-4-piperidyl) sebacate, bis(1,2,2,6,6-pentamethyl-4-piperidyl)sebacate, and bis(1,2,2,6,6-pentamethyl-4-piperidyl)[{3,5-bis(1,1-dimethylethyl)-4-hydroxyphenyl}methyl]butylmalonate; and the like.

These UV absorbers may be used either individually or in combination. The UV absorber is normally used in an amount of 0.01 to 10 parts by weight relative to 100 parts by weight of a polyorganosiloxane compound.

The photostablizer is added to increase the light resistance of the molding material.

Examples of the photostabilizer include hindered amines such as poly[{6-(1,1,3,3-tetramethylbutyl)amino-1,3,5-triazine-2,4-diyl}{(2,2,6,6-tetramethyl-4-piperidine)imino}hexamethylene{(2,2,6,6-tetramethyl-4-piperidine)imino}], and the like.

These photostabilizers may be used either individually or in combination. The photostabilizer is normally used in an amount of 0.01 to 10 parts by weight relative to 100 parts by weight of a polyorganosiloxane compound.

The diluent is added to adjust the viscosity of the molding material.

Examples of the diluent include glycerol diglycidyl ether, butanediol diglycidyl ether, diglycidyl aniline, neopentyl glycol glycidyl ether, cyclohexanedimethanol diglycidyl ether, alkylene diglycidyl ether, polyglycol diglycidyl ether, polypropylene glycol diglycidyl ether, trimethylolpropane triglycidyl ether, glycerol triglycidyl ether, 4-vinylcyclohexene mono-oxide, vinylcyclohexene dioxide, methylated vinylcyclohexene dioxide, and the like. These diluents may be used either individually or in combination.

The silane coupling agent is added in increase adhesion of the molding material to another material.

Examples of the silane coupling agent include 3-glycidoxypropyltrimethoxysilane, 3-glycidoxypropyltriethoxysilane, 2-(3,4-epoxycyclohexyl)ethyltrimethoxysilane, 2-(3,4-epoxycyclohexyl)ethyltriethoxysilane, vinyltrimethoxysilane, vinyltriethoxysilane, and the like.

The molding material according to the present invention may include a polyorganosiloxane compound other than the polyorganosiloxane compound (Ia) or the polyorganosiloxane compound (Ib) (as, main component) insofar as the object of the present invention is not impaired.

The molding material according to the present invention may include a curing agent. Note that a curing reaction smoothly proceeds without using a curing agent. Since a curing agent may cause deterioration, it is preferable not to use a curing agent in order to maintain excellent transparency and heat resistance for a long time.

Examples of a curing agent include an acid anhydride, an aromatic amine, a phenol resin, a photoinitiator, and the like.

The molding material according to the present invention may be produced by adding one or more other optional components to the polyorganosiloxane compound (Ia) or the polyorganosiloxane compound (Ib), for example.

The molding material according to the present invention may be used as a semiconductor (e.g. IC) sealing material, an optical device (e.g. LED) sealing material, and an electrical insulating material for printed circuit boards, etc.; a building material such as a lamp cover or a window material; and the like. Among these, the molding material is preferably used as a sealing material. The molding material is particularly preferably used as an optical device sealing material due to excellent heat resistance and transparency.

A cured product exhibiting excellent transparency and heat resistance for a long time without showing coloration or a decrease in transparency due to high-energy light or heat produced by an optical device which emits light with a short wavelength and high brightness can be obtained in case of utilizing the molding material as an optical device sealing material.

The long-lasting superior heat resistance of the cured product of the optical device sealing material according to the present invention may be confirmed by, for example, the fact that there is almost no decrease in transmittance when the cured product is subjected to a high temperature for a long time (e.g., at 150° C. for 500 hours).

2) Sealed Optical Device

The sealed optical device according to the present invention is an optical device which is sealed with a cured product of the sealing material (optical device sealing material) according to the present invention.

Examples of the optical device include light-emitting devices such as an LED and an LD, a light-receiving device, a hybrid optical device, an optical integrated circuit, and the like.

The sealed optical device according to the present invention may be obtained by molding the sealing material according to the present invention into a desired shape to obtain a molded product which encloses the optical device, and curing the molded product, for example.

Various methods may be used to mold the sealing material according to the present invention into a desired shape. For example, a usual method of transfer molding, an heretofore known method of molding as casting, or the like may be used.

The molded product which encloses the optical device may be cured by a heating method, a method of curing the molded product which includes a curing agent, a combination thereof, or the like. Among these, the heating method is preferable. Since the present invention utilizes a polyorganosiloxane compound obtained by condensation of a specific silane compound, a cured product can be obtained in high yield only by heating without using a curing agent.

When using the heating method, the heating temperature differs depending on the type of the optical device sealing material, but is normally 100 to 200° C. The heating time is normally 10 minutes to 20 hours, and preferably 30 minutes to 10 hours.

Figure 1:
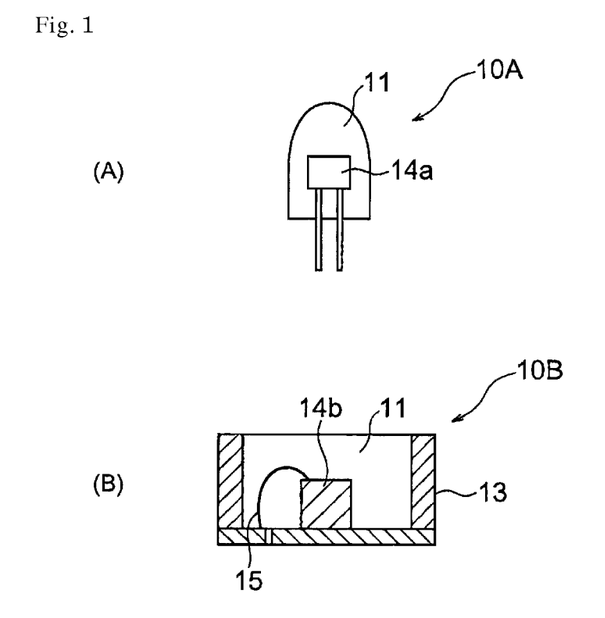
FIG. 1 is a view showing an example of a sealed optical device according to the present invention.

FIG. 1 shows an example of the sealed optical device according to the present invention. FIG. 1(A) shows a lamp-shaped sealed LED (10A) in which an optical device (LED chip) (14a) is sealed with a cured product (11) of the sealing material according to the present invention which is molded into a lamp shape.

FIG. 1(B) shows an SMD (surface mount device)-type sealed LED (10B) in which a cured product (11) of the sealing material according to the present invention is provided inside a cuboid casing (13) which has an upper opening and in which an LED chip (14b) is mounted on the bottom thereof. In FIG. 1(B), 15 indicates a wire of the LED chip.

The sealed optical device shown in FIG. 1 may be produced as follows.

Figure 2:
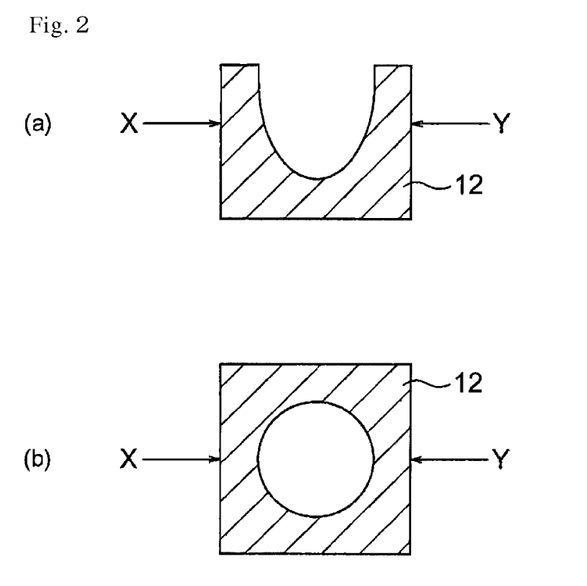
FIG. 2 is a schematic view showing a mold used to produce a lamp-shaped sealed LED.

The lamp-shaped sealed LED (10A) may be produced using a mold (12) having a lamp-shaped recess shown in FIGS. 2(a) and 2(b). FIG. 2(a) shows a cross-sectional view showing the mold (12) along the X-Y direction, and FIG. 2(b) is a top view showing the mold (12).

Figure 3:
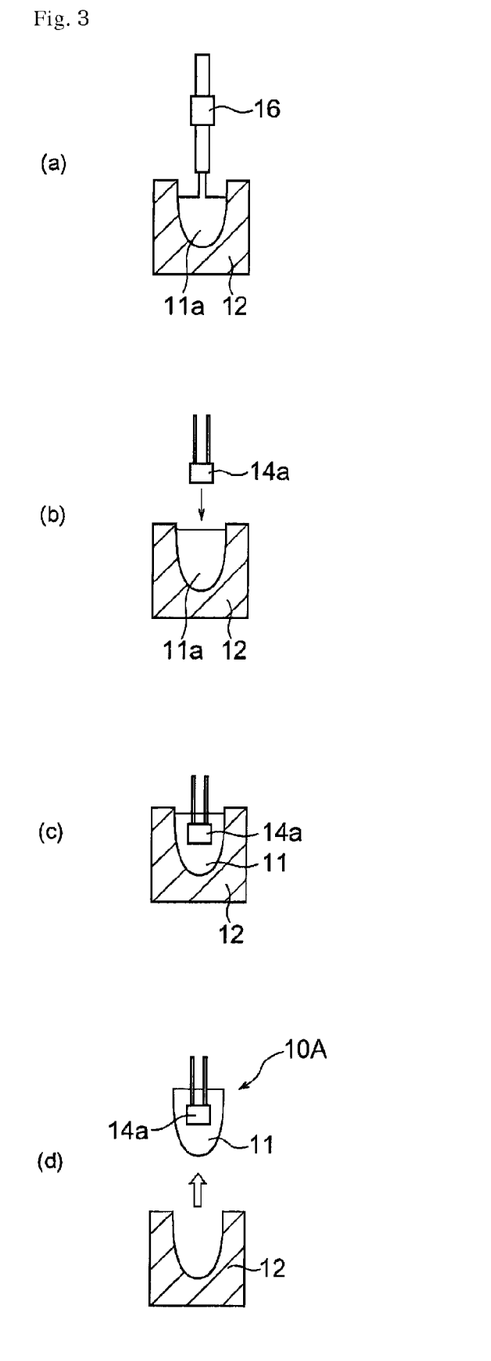
FIG. 3 is a cross-sectional view showing a process of producing a lamp-shaped sealed LED.

As shown in FIG. 3(a), an optical device sealing material (11a) according to the present invention is injected into the mold (12) using a sealing material injector (16). FIG. 3(a) shows only a nozzle of the sealing material injector (16) for convenience.

As shown in FIG. 3(b), an LED chip (14a) is inserted into the sealing material at an appropriate position. As shown in FIG. 3(c), the entire sealing material is heated to a given temperature to cure the sealing material and integrate the LED chip (14a) with the sealing material. As shown in FIG. 3(d), the cured product is taken out from the mold (12) to obtain the lamp-shaped sealed LED (10A).

Figure 4:
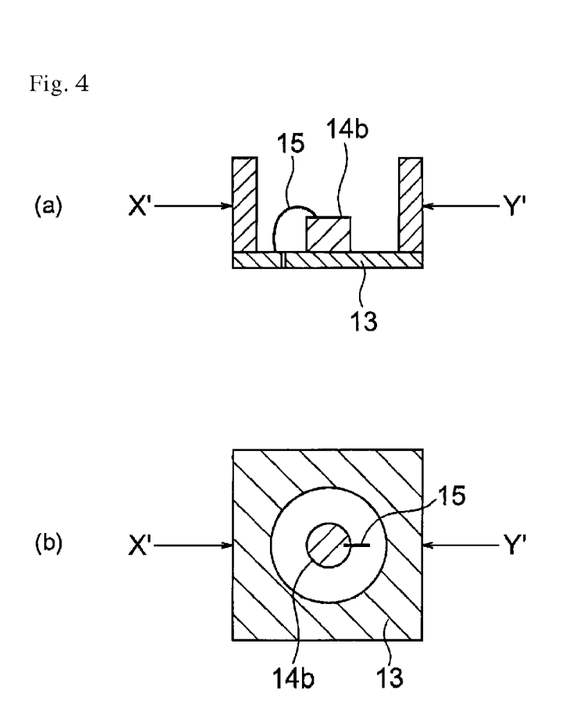
FIG. 4 is a schematic view showing a cuboid casing used to produce an SMD-type sealed LED.

The SMD-type sealed LED (10B) may be produced using the cuboid casing (13) which has an upper opening and in which the LED chip (14b) is mounted on the bottom (see FIGS. 4(a) and 4(b)). FIG. 4(a) is a cross-sectional view showing the cuboid casing (13) along the X'-Y' direction, and FIG. 4(b) is a top view showing the cuboid casing (13).

Figure 5:
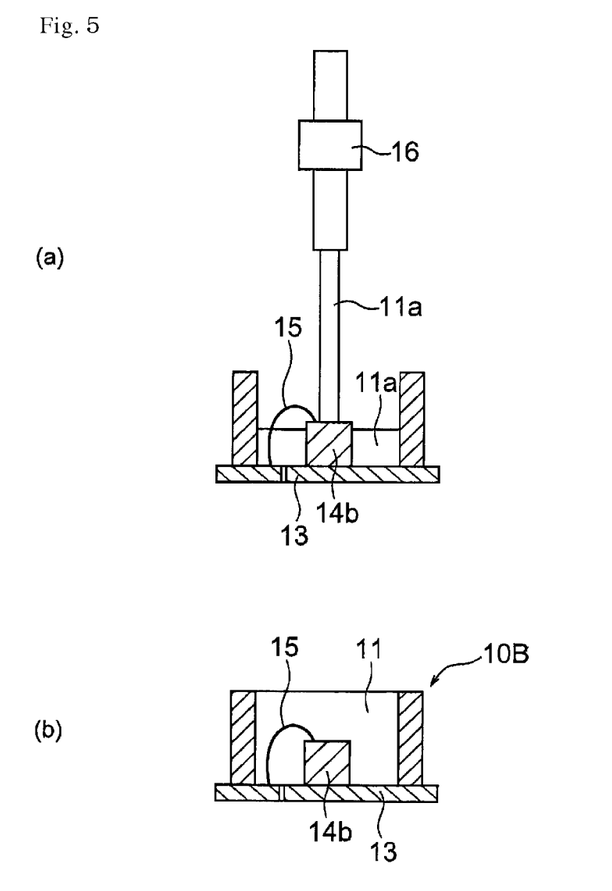
FIG. 5 is a cross-sectional view showing a process of producing an SMD-type sealed LED.

As shown in FIG. 5(a), the optical device sealing material (11a) according to the present invention is injected into the cuboid casing (13) using the sealing material injector (16). FIG. 5(a) shows only a nozzle of the sealing material injector (16) for convenience.

The entire sealing material (11a) is heated to a given temperature to cure the sealing material (11a). The SMD-type sealed LED (10B) shown in FIG. 5(b) is thus obtained.

Since the sealed optical device according to the present invention is produced using the sealing material according to the present invention, the sealed optical device exhibits excellent heat resistance (i.e., does not undergo coloration or deterioration due to heat or light) even if the optical device is a white or blue LED or the like which has a short peak wavelength of 350 to 490 nm.

EXAMPLES

The present invention is further described below by way of examples and comparative examples. Note that the present invention is not limited to the following examples.
(Measurement of Weight Average Molecular Weight)

The weight average molecular weight (Mw) was determined as a standard polystyrene-reduced value by gel permeation chromatography (GPC) using tetrahydrofuran (THF) as a solvent.

The measurement was carried out using a GPC system ("HLC-8220 GPC" manufactured by Tosoh Corporation) under the following conditions.
Column: TSKgel GMHXL→TSKgel GMHXL→TSKgel 2000 HXL
Solvent: THF
Measurement temperature: 40° C.
Flow rate: 1 ml/min.
Detector: differential refractometer Example 1

A 200 ml recovery flask equipped with a stiffing rod was charged with 3.97 g (20 mmol) of 3-chloropropyltrimethoxysilane (manufactured by Tokyo Kasei Kogyo Co., Ltd.) as a silane compound (1), 3.97 g (20 mmol) of phenyltrimethoxysilane (manufactured by
Tokyo Kasei Kogyo Co., Ltd.) as a silane compound (2), 20 ml of toluene and 10 ml of distilled water as a solvent. After the addition of 0.10 g (1 mmol) of phosphoric acid (manufactured by Kanto Chemical Co., Inc.) (catalyst) with stirring, the mixture was stirred at room temperature for 16 hours. After completion of the reaction, a saturated sodium hydrogencarbonate aqueous solution was added to neutralize the reaction mixture. 100 ml of ethyl acetate was added to the neutralized reaction mixture to separate an organic layer. The organic layer was washed twice with distilled water, and dried over anhydrous magnesium sulfate. After separating anhydrous magnesium sulfate by filtration, the filtrate was added dropwise to a large quantity of n-hexane to cause precipitation. The precipitate was separated by decantation. The precipitate was dissolved in tetrahydrofuran (THF) to recover the product. After evaporating THF using an evaporator under reduced pressure, the residue was dried under vacuum to obtain a polyorganosiloxane compound 1 (weight average molecular weight (Mw)=3,400). The polyorganosiloxane compound 1 was confirmed to have a ladder structure by an IR spectrum (Fourier-transform infrared spectrophotometer (FT-IR)) and X-ray diffraction. The resulting polyorganosiloxane compound was solely used as an optical device sealing material 1 without adding additives.

Example 2

A polyorganosiloxane compound 2 (Mw=2,100) was obtained in the same manner as in Example 1, except for using 1.99 g (10 mmol) of 3-chloropropyltrimethoxysilane (manufactured by Tokyo Kasei Kogyo Co., Ltd.) as a silane compound (1), and using 3.97 g (20 mmol) of phenyltrimethoxysilane and 2.06 g (10 mmol) of n-hexyltrimethoxysilane (manufactured by Tokyo Kasei Kogyo Co., Ltd.) as silane compounds (2). The polyorganosiloxane compound 2 was confirmed to have a ladder structure by an IR spectrum (Fourier-transform infrared spectrophotometer (FT-IR)) and X-ray diffraction. The resulting polyorganosiloxane compound was solely used as an optical device sealing material 2 without adding additives.

Example 3

0.005 g of tris(2,4-di-tert-butylphenyl)phosphite (manufactured by Tokyo Kasei Kogyo Co., Ltd.) and 0.005 g of tetrakis[methylene-3-(3',5'-di-tert-butyl-4'-hydroxyphenyl) propionate]methane (manufactured by Tokyo Kasei Kogyo Co., Ltd.) (antioxidant) were added to 2.00 g of polyorganosiloxane compound 1 obtained in Example 1. The mixture was stirred to obtain an optical device sealing material 3.

Example 4

A polyorganosiloxane compound 3 (Mw=2,100) was obtained in the same manner as in Example 1, except for using 4.37 g (20 mmol) of 3,3,3-trifluoropropyltrimethoxysilane (manufactured by AZmax Co.) instead of 3.97 g (20 mmol) of 3-chloropropyltrimethoxysilane as the silane compound (1). The polyorganosiloxane compound 3 was confirmed to have a ladder structure by an IR spectrum (Fourier-transform infrared spectrophotometer (FT-IR)) and X-ray diffraction. The resulting polyorganosiloxane compound was solely used as an optical device sealing material 4 without adding additives.

Preparation Example 1

Preparation of 2-(2-chloroethoxy)ethyltrimethoxysilane

A 50 ml two-necked recovery flask equipped with a thermometer and a calcium chloride tube was charged with 4.26 g (40 mmol) of 2-chloroethylvinyl ether (manufactured by Tokyo Kasei Kogyo Co., Ltd.) and 0.2 g of a platinum catalyst ("BY 24-835" manufactured by Toray-Dow Corning Co.). Then, 4.89 g (40 mmol) of trimethoxysilane (manufactured by Tokyo Kasei Kogyo Co., Ltd.) was slowly added with stiffing while controlling the temperature at 50° C. or less. After then, more 0.2 g of the platinum catalyst was added and the mixture was stirred at room temperature (20° C.) for 6 hours. The reaction mixture was distilled under reduced pressure to obtain 7.32 g of the target 2-(2-chloroethoxy)ethyltrimethoxysilane.

Example 5

A polyorganosiloxane compound 4 (Mw=2,300) was obtained in the same manner as in Example 1, except for using 4.58 g (20 mmol) of 2-(2-chloroethoxy)ethyltrimethoxysilane obtained in the Preparation Example 1 instead of 3.97 g (20 mmol) of 3-chloropropyltrimethoxysilane as a silane compound (1). The polyorganosiloxane compound 4 was confirmed to have a ladder structure by an IR spectrum (Fourier-transform infrared spectrophotometer (FT-IR)) and X-ray diffraction. The resulting polyorganosiloxane compound was solely used as an optical device sealing material 5 without adding additives.

Example 6

A 200 ml recovery flask equipped with a stiffing rod was charged with 3.51 g (20 mmol) of 2-cyanoethyltrimethoxysilane (manufactured by AZmax Co.) as a silane compound (1), 3.97 g (20 mmol) of phenyltrimethoxysilane (manufactured by Tokyo Kasei Kogyo Co., Ltd.) as a silane compound (2), and 20 ml of toluene and 10 ml of distilled water as a solvent. After the addition of 0.10 g (1 mmol) of phosphoric acid (manufactured by Kanto Chemical Co., Inc.) (catalyst) with stiffing, the mixture was stirred at room temperature for 16 hours.

After completion of the reaction, a saturated sodium hydrogencarbonate aqueous solution was added to neutralize the reaction solution. The mixture was allowed to stand for a short time, toluene and water were removed from the reaction mixture. The residue was washed twice with distilled water, dissolved in 100 ml of 2-butanone, and dried with anhydrous magnesium sulfate. After separating the anhydrous magnesium sulfate by filtration, the filtrate was added dropwise to a large quantity of n-hexane to precipitate the resulting resin, which was separated by decantation. The precipitate was dissolved in tetrahydrofuran (THF) to recover the resulting product. After evaporating THF by an evaporator under reduced pressure, the residue was dried under vacuum to obtain a polyorganosiloxane compound 6 (weight average molecular weight (Mw)=3,800). The resulting polyorganosiloxane compound 6 was solely used as an optical device sealing material 6 without adding additives.

Example 7

A polyorganosiloxane compound 7 (Mw=4,000) was obtained in the same manner as in Example 6, except for using 4.63 g (20 mmol) of 3-cyanopropyltriethoxysilane (manufactured by AZmax Co.) as a silane compound (1).

The resulting polyorganosiloxane compound 7 was solely used as an optical device sealing material 7 without adding additives.

Example 8

A polyorganosiloxane compound 8 (Mw=3,300) was obtained in the same manner as in Example 6, except for using 1.75 g (10 mmol) of 2-cyanoethyltrimethoxysilane as a silane compound (1) and 5.95 g (30 mmol) of phenyltrimethoxysilane as a silane compound (2).

The resulting polyorganosiloxane compound 8 was solely used as an optical device sealing material 8 without adding additives.

Example 9

A polyorganosiloxane compound 9 (Mw=3,300) was obtained in the same manner as in Example 6, except for using 2.10 g (12 mmol) of 2-cyanoethyltrimethoxysilane as a silane compound (1) and 4.76 g (24 mmol) of phenyltrimethoxysilane and 0.83 g (4 mmol) n-hexyltrimethoxysilane (manufactured by Tokyo Kasei Kogyo Co., Ltd.) as silane compounds (2).

The polyorganosiloxane compound 9 was solely used as an optical device sealing material 9 without adding additives.

Example 10

A polyorganosiloxane compound 10 (Mw=2,800) was obtained in the same manner as in Example 6, except for using 0.70 g (4 mmol) of 2-cyanoethyltrimethoxysilane as a silane compound (1), and 3.97 g (20 mmol) of phenyltrimethoxysilane and 3.56 g (16 mmol) of 3-acetoxypropyltrimethoxysilane (manufactured by AZmax Co.) as silane compounds (2).

The resulting polyorganosiloxane compound 10 was solely used as an optical device sealing material 10 without adding additives.

Example 11

A polyorganosiloxane compound 11 (Mw=2,900) was obtained in the same manner as in Example 6, except for using 0.70 g (4 mmol) of 2-cyanoethyltrimethoxysilane as a silane compound (1), and 4.76 g (24 mmol) of phenyltrimethoxysilane and 2.67 g (12 mmol) of 3-acetoxypropyltrimethoxysilane as silane compounds (2).

The resulting polyorganosiloxane compound 11 was solely used as an optical device sealing material 11 without adding additives.

Example 12

A polyorganosiloxane compound 12 (Mw=3,100) was obtained in the same manner as in Example 6, except for using 1.40 g (8 mmol) of 2-cyanoethyltrimethoxysilane as a silane compound (1), and 3.97 g (20 mmol) of phenyltrimethoxysilane and 2.67 g (12 mmol) of 3-acetoxypropyltrimethoxysilane as silane compounds (2).

The resulting polyorganosiloxane compound 12 was solely used as an optical device sealing material 12 without adding additives.

Example 13

A polyorganosiloxane compound 13 (Mw=3,000) was obtained in the same manner as in Example 6, except for using 0.70 g (4 mmol) of 2-cyanoethyltrimethoxysilane as a silane compound (1), and 3.97 g (20 mmol) of phenyltrimethoxysilane and 3.18 g (16 mmol) of 3-chloropropyltrimethoxysilane (manufactured by Tokyo Kasei Kogyo Co., Ltd.) as silane compounds (2).

The resulting polyorganosiloxane compound 13 was solely used as an optical device sealing material 13 without adding additives.

The IR spectrum (Fourier-transform infrared spectrophotometer (FT-IR)) data of the polyorganosiloxane compounds 1 to 13 obtained in Examples 1 to 13 is shown in Tables 1 and 2.

TABLE 1

| | Polyorganosiloxane compound | Si—Ph $cm^{-1}$ | | Si—O $cm^{-1}$ | | —Cl $cm^{-1}$ | —F $cm^{-1}$ |
|---|---|---|---|---|---|---|---|
| Example 1 | 1 | 741.05 | 700.20 | 1133.02 | 1042.55 | 648.56 | — |
| Example 2 | 2 | 741.59 | 699.89 | 1132.56 | 1042.26 | 647.58 | — |
| Example 3 | 1 | 741.07 | 700.16 | 1133.01 | 1042.58 | 648.56 | — |
| Example 4 | 3 | 741.12 | 700.12 | 1132.84 | 1042.89 | — | 1198.12 |
| Example 5 | 4 | 740.57 | 699.54 | 1132.68 | 1042.74 | 647.12 | — |

TABLE 2

| | Polyorganosiloxane compound | Si—Ph $cm^{-1}$ | | Si—O $cm^{-1}$ | | —CN $cm^{-1}$ | —CO $cm^{-1}$ | —Cl $cm^{-1}$ |
|---|---|---|---|---|---|---|---|---|
| Example 6 | 6 | 741.75 | 700.04 | 1132.65 | 1042.56 | 2251.80 | — | — |
| Example 7 | 7 | 741.62 | 700.20 | 1133.01 | 1042.22 | 2252.50 | — | — |
| Example 8 | 8 | 741.44 | 699.78 | 1133.01 | 1042.60 | 2252.07 | — | — |
| Example 9 | 9 | 742.08 | 711.21 | 1132.91 | 1042.88 | 2251.56 | — | — |
| Example 10 | 10 | 741.75 | 700.04 | 1132.65 | 1043.11 | 2252.13 | 1738.11 | — |
| Example 11 | 11 | 742.12 | 700.51 | 1133.00 | 1042.61 | 2251.73 | 1737.56 | — |
| Example 12 | 12 | 741.88 | 701.05 | 1132.87 | 1042.75 | 2251.95 | 1737.66 | — |
| Example 13 | 13 | 740.35 | 700.86 | 1133.12 | 1042.63 | 2250.41 | — | 648.17 |

Comparative Example 1

A polyorganosiloxane compound 6 (Mw=1,600) and an optical device sealing material 14 were obtained in the same manner as in Example 1 except for using 4.73 g (20 mmol) of 3-glycidoxypropyltrimethoxysilane instead of 3-chloropropyltrimethoxysilane as a silane compound (1) and 0.10 g (1 mmol) of methanesulfonic acid instead of phosphoric acid.

Comparative Example 2

An optical device sealing material 15 of an epoxy resin composition was obtained by sufficiently mixing 2 g of 3,4-epoxycyclohexylmethyl-3,4-epoxycyclohexanecarboxylate (manufactured by Aldrich), 1 g of 2,2-bis(4-glycidyloxyphenyl)propane (manufactured by Tokyo Kasei Kogyo Co., Ltd.), 3 g of 4-methylcyclohexane-1,2-dicarboxylic anhydride (manufactured by Tokyo Kasei Kogyo Co., Ltd.), and 0.03 g of triphenylphosphine (manufactured by Kanto Chemical Co., Inc.) in a 20 ml glass tube.

The initial transmittance and the transmittance after heating were measured to evaluate the transparency and the heat resistance of the optical device sealing materials obtained in Examples 1 to 13 and Comparative Examples 1 and 2 according to the following methods. The results are shown in Table 3.

(Measurement of Initial Transmittance)

The polyorganosiloxane compound was poured into a mold with a length of 25 mm, a width of 20 mm, and a thickness of 1 mm, and cured by heating at 135° C. for 12 hours to obtain a specimen. The initial transmittance of the specimen at wavelengths of 365 nm, 400 nm, 450 nm, and 500 nm was measured by a spectrophotometer ("MPC-3100" manufactured by Shimadzu Corporation).

(Measurement of Transmittance After Heating)

After measuring the initial transmittance, the specimen was heated in an oven at 150° C. for 100 hours and 500 hours. The transmittance after heating at wavelengths of 365 nm, 400 nm, 450 nm, and 500 nm was measured.

(Transparency)

A specimen having an initial transmittance of 85% or more at a wavelength of 400 nm was evaluated as "Good", a specimen having an initial transmittance of 70% or more and less than 85% was evaluated as "Fair", and a specimen having an initial transmittance of less than 70% was evaluated as "Bad".

(Heat Resistance)

A value calculated using the initial transmittance and the transmittance after heating at 150° C. for 500 hours at a wavelength of 400 nm was applied to the following expression. The heat resistance was evaluated as "Good" when the resulting value was 70 or more, evaluated as "Fair" when the resulting value was 50 or more and less than 70, and evaluated as "Bad" when the resulting value was less than 50.

(Transmittance at 400 nm after heating)/(initial transparency at 400 nm)×100

As shown in Table 3, a cured product (sealing material) with excellent transparency and heat resistance can be produced by using the sealing materials for an optical device 1 to 13 obtained in Examples 1 to 13.

On the other hand, the optical device sealing material 14 obtained in Comparative Example 1 was inferior in heat resistance as demonstrated by the remarkably decreased transparency after the heating test.

The optical device sealing material 15 obtained in Comparative Example 2 had low initial transparency (especially at 365 nm and 400 nm). Also, the transparency after the heating test decreased substantially.

Industrial Applicability

The molding material according to the present invention can produce a cured product exhibiting excellent transparency and heat resistance for a long time without showing a decrease in transparency due to coloration caused by high-energy light or heat produced by an optical device. Therefore, the molding material according to the present invention is particularly useful as a molding material for sealed optical devices.

The invention claimed is:

1. A method of producing a sealed optical device, comprising:

sealing an optical device with a cured molding material as an optical device sealing material, the molding material comprising a polyorganosiloxane compound as a main component, the polyorganosiloxane compound having a ladder structure including a repeating unit shown by the following formula (I) in the molecule,

TABLE 3

| | | Optical device sealing material | Transparency (%) | | | | | | | | | | | | Transparency | Heat resistance |
|---|---|---|---|---|---|---|---|---|---|---|---|---|---|---|---|---|
| | | | Initial | | | | After heating for 100 hours | | | | After heating for 500 hours | | | | | |
| | | | 365 (nm) | 400 (nm) | 450 (nm) | 500 (nm) | 365 (nm) | 400 (nm) | 450 (nm) | 500 (nm) | 365 (nm) | 400 (nm) | 450 (nm) | 500 (nm) | | |
| Example | 1 | 1 | 86.1 | 88.3 | 89.3 | 90.2 | 79.5 | 84.7 | 88.0 | 89.6 | 74.7 | 80.3 | 87.2 | 89.3 | Good | Good |
| | 2 | 2 | 85.8 | 88.2 | 89.3 | 90.2 | 71.2 | 79.9 | 85.5 | 88.6 | 61.2 | 75.4 | 84.2 | 88.3 | Good | Good |
| | 3 | 3 | 85.6 | 88.2 | 89.1 | 89.9 | 77.4 | 87.0 | 89.3 | 90.4 | 47.7 | 82.7 | 86.9 | 88.3 | Good | Good |
| | 4 | 4 | 76.6 | 85.8 | 87.9 | 89.9 | 76.6 | 83.4 | 87.6 | 89.7 | 75.5 | 82.5 | 86.8 | 89.0 | Good | Good |
| | 5 | 5 | 85.7 | 88.7 | 89.6 | 90.3 | 84.8 | 87.8 | 89.2 | 90.0 | 82.2 | 85.8 | 88.3 | 89.6 | Good | Good |
| | 6 | 6 | 90.1 | 90.3 | 90.8 | 91.1 | 85.4 | 87.2 | 89.3 | 90.7 | 81.6 | 85.9 | 88.5 | 90.0 | Good | Good |
| | 7 | 7 | 89.6 | 90.2 | 90.5 | 90.8 | 83.2 | 85.9 | 87.2 | 89.6 | 80.1 | 83.4 | 85.9 | 88.3 | Good | Good |
| | 8 | 8 | 90.1 | 90.6 | 91.0 | 91.4 | 87.8 | 88.9 | 89.3 | 91.4 | 85.4 | 88.3 | 89.0 | 91.2 | Good | Good |
| | 9 | 9 | 88.1 | 89.8 | 90.3 | 91.8 | 83.2 | 85.1 | 89.5 | 90.2 | 80.1 | 82.5 | 85.9 | 89.7 | Good | Good |
| | 10 | 10 | 89.7 | 90.8 | 91.1 | 91.4 | 85.6 | 88.2 | 90.7 | 91.1 | 80.4 | 84 | 88.2 | 90.1 | Good | Good |
| | 11 | 11 | 89.8 | 90.1 | 90.7 | 90.9 | 85.1 | 88.9 | 90.0 | 90.1 | 81.0 | 85.5 | 87.9 | 90.1 | Good | Good |
| | 12 | 12 | 89.3 | 90.9 | 91.3 | 91.5 | 84.4 | 89.2 | 90.2 | 90.9 | 80.9 | 84.9 | 88.1 | 90.3 | Good | Good |
| | 13 | 13 | 90.1 | 90.8 | 91.4 | 92.0 | 84.0 | 88.7 | 90.8 | 91.2 | 81.7 | 83.2 | 86.9 | 90.9 | Good | Good |
| Comparative Example 1 | 14 | 14 | 84.7 | 89.3 | 90.1 | 90.9 | 8.9 | 15.4 | 39.8 | 63.2 | 0.9 | 7.4 | 29.3 | 58.5 | Good | Bad |
| Comparative Example 2 | 15 | 15 | 0.8 | 47.9 | 82.2 | 88.7 | 0.8 | 22.7 | 62.3 | 84.1 | 0.8 | 13.5 | 50.4 | 75.0 | Bad | Bad |

[Chemical Formula 1] (I)

wherein A represents an alkylene group having 1 to 6 carbon atoms or an alkyleneoxy group having 1 to 6 carbon atoms of which the carbon atom bonds to the silicon atom, $R^1$ represents a hydrogen atom or an alkyl group having 1 to 6 carbon atoms, $X^0$ represents a haloalkyl group having 1 to 10 carbon atoms, or a cyano group, $R^2$ represents a substituted or unsubstituted phenyl group, an alkyl group having 1 to 20 carbon atoms that is optionally substituted except with a halogen atom or a cyano group, an alkenyl group having 2 to 20 carbon atoms, or a group shown by $-A^1-CH(X^1)-R^3$ wherein $A^1$ represents a single bond or a linking group, $X^1$ represents a hydrogen atom or a group shown by OG wherein G represents a protecting group for a hydroxyl group, and $R^3$ represents a hydrogen atom or an alkyl group having 1 to 6 carbon atoms, and l, m, and n are individually 0 or an arbitrary natural number, provided that l and n are not 0 at the same time;
wherein the polyorganosiloxane compound has a weight average molecular weight of 1,000 to 10,000.

2. The method according to claim 1, wherein the polyorganosiloxane compound is obtained by reacting a silane compound (1) shown by $X^0-CH(R^1)-A-Si(OR^4)_p(X^2)_{3-p}$ wherein $X^0$, $R^1$, and A are the same as defined above, $R^4$ represents an alkyl group having 1 to 6 carbon atoms, $X^2$ represents a halogen atom, and p is an integer from 0 to 3 and a silane compound (2) shown by $R^2Si(OR^5)_q(X^3)_{3-q}$, wherein $R^2$ is the same as defined above, $R^5$ represents an alkyl group having 1 to 6 carbon atoms, $X^3$ represents a halogen atom, and q is an integer from 0 to 3 in a molar ratio of 5:95 to 100:0 (=silane compound (1):silane compound (2)) in the presence of a catalyst.

3. A method of producing an optical device sealing material, comprising:
reacting a silane compound (1) shown by $X^0-CH(R^1)-A-Si(OR^4)_p(X^2)_{3-p}$ wherein $X^0$ represents a haloalkyl group having 1 to 10 carbon atoms, or a cyano group, $R^1$ represents a hydrogen atom or an alkyl group having 1 to 6 carbon atoms, A represents an alkylene group having 1 to 6 carbon atoms or an alkyleneoxy group having 1 to 6 carbon atoms of which the carbon atom bonds to the silicon atom, $R^4$ represents an alkyl group having 1 to 6 carbon atoms, $X^2$ represents a halogen atom, and p is an integer from 0 to 3 and a silane compound (2) shown by $R^2Si(OR^5)_q(X^3)_{3-q}$ wherein $R^2$ represents a substituted or unsubstituted phenyl group, an alkyl group having 1 to 20 carbon atoms that is optionally substituted except with a halogen atom or a cyano group, an alkenyl group having 2 to 20 carbon atoms, or a group shown by $-A^1-CH(X^1)-R^3$ wherein $A^1$ represents a single bond or a linking group, $X^1$ represents a hydrogen atom or a group shown by OG wherein G represents a protecting group for a hydroxyl group, $R^3$ represents a hydrogen atom or an alkyl group having 1 to 6 carbon atoms, $R^5$ represents an alkyl group having 1 to 6 carbon atoms, $X^3$ represents a halogen atom, and q is an integer from 0 to 3 in a molar ratio of 5:95 to 100:0 (=silane compound (1):silane compound (2)) in the presence of a catalyst to obtain a polyorganosiloxane compound;
preparing a cured molding material comprising the polyorganosiloxane as a main component to produce the optical device sealing material;
wherein the polyorganosiloxane compound has a weight average molecular weight of 1,000 to 10,000.

4. The method according to claim 1, the molding material not containing a curing agent.

5. A sealed optical device comprising an optical device, the optical device being sealed with a cured product of a sealing material comprising a polyorganosiloxane compound as a main component, the polyorganosiloxane compound having a ladder structure including a repeating unit shown by the following formula (I) in the molecule,

[Chemical Formula 1] (I)

wherein A represents an alkylene group having 1 to 6 carbon atoms or an alkyleneoxy group having 1 to 6 carbon atoms of which the carbon atom bonds to the silicon atom, $R^1$ represents a hydrogen atom or an alkyl group having 1 to 6 carbon atoms, $X^0$ represents a haloalkyl group having 1 to 10 carbon atoms, or a cyano group, $R^2$ represents a substituted or unsubstituted phenyl group, an alkyl group having 1 to 20 carbon atoms that is optionally substituted except with a halogen atom or a cyano group, an alkenyl group having 2 to 20 carbon atoms, or a group shown by $-A^1-CH(X^1)-R^3$ wherein $A^1$ represents a single bond or a linking group, $X^1$ represents a hydrogen atom or a group shown by OG wherein G represents a protecting group for a hydroxyl group, and $R^3$ represents a hydrogen atom or an alkyl group having 1 to 6 carbon atoms, and l, m, and n are individually 0 or an arbitrary natural number, provided that l and n are not 0 at the same time.

* * * * *